United States Patent [19]
Kratz et al.

[11] Patent Number: 5,307,063
[45] Date of Patent: Apr. 26, 1994

[54] SUPERCONDUCTING A/D CONVERTER

[75] Inventors: Harald Kratz, Tettnang; Wolfgang Ludwig, Trägerwilen, both of Fed. Rep. of Germany

[73] Assignee: Dornier GmbH, Fed. Rep. of Germany

[21] Appl. No.: 767,782

[22] Filed: Sep. 30, 1991

[30] Foreign Application Priority Data

Oct. 1, 1990 [DE] Fed. Rep. of Germany ....... 4030988

[51] Int. Cl.$^5$ .............................................. H03M 1/12
[52] U.S. Cl. ...................................... 341/133; 505/827
[58] Field of Search ............... 341/133, 137, 155, 171; 505/827, 832, 848, 849; 250/336.2, 338.1

[56] References Cited

U.S. PATENT DOCUMENTS

| | | | |
|---|---|---|---|
| 4,315,255 | 2/1982 | Harris et al. | 341/133 |
| 4,484,074 | 11/1984 | Eder | 250/336.1 |
| 4,497,068 | 1/1985 | Fischer | 455/608 |
| 4,672,359 | 6/1987 | Silver | 341/133 |
| 4,836,634 | 6/1989 | Laude | 350/96.19 |
| 5,010,346 | 4/1991 | Hamilton et al. | 341/137 |
| 5,021,658 | 6/1991 | Bluzer | 250/336.2 |

FOREIGN PATENT DOCUMENTS 0280282  8/1988  European Pat. Off. .
3310245  3/1983  Fed. Rep. of Germany .

OTHER PUBLICATIONS

The Quantitative Determination of Flux-Density Gradients in Type II Superconductors by Means of the Magneto-Optical Faraday Effecty by H. U. Habermeir, et al. pp. 187-194, Sep. 1978, Phys. Stat. Sol. (a) 50.

*Primary Examiner*—Brian K. Young
*Attorney, Agent, or Firm*—Evenson, McKeown, Edwards & Lenahan

[57] ABSTRACT

A superconducting analog-digital converter in which at least one of the electrical feed lines or conductance lines is replaced by an optical feed line. Current input and output signals being converted or generated by optoelectronic and/or magneto-optical elements.

4 Claims, 3 Drawing Sheets

SUPERCONDUCTING A/D CONVERTER

BACKGROUND AND SUMMARY OF THE INVENTION

The invention relates to a superconducting A/D converter.

Superconducting A/D converters are known from several publications, for example German Patent Documents 33 10 245, 37 38 369, and 36 39 623. In all these devices it is necessary to supply direct current or electrical pulses to the converter. This occurs through metallic conductors as a rule. Since the converters are operated at low temperatures (in cyrostats), the electrical leads also act as heat conductors, resulting in heat losses. In systems with several A/D converters operating simultaneously, electrical couplings can also occur between the individual leads, resulting in power losses in the individual converters.

An object of the present invention is to provide a superconducting A/D converter that functions reliably in a superconducting state within a system composed of several A/D converters operating simultaneously; specifically, it must not lose its superconducting ability.

This goal is achieved according to the invention by the use of optical conductors (light guides) in place of metallic lines to provide inputs to the A/D converter. Such optical conductors are normally made of glass and exhibit very low thermal conductivity. The use of glass fibers prevents coupling between the leads while thermal losses are very low even in a multichannel system.

Other objects, advantages and novel features of the present invention will become apparent from the following detailed description of the invention when considered in conjunction with the accompanying drawings.

DETAILED DESCRIPTION OF THE DRAWINGS

Figure 1:
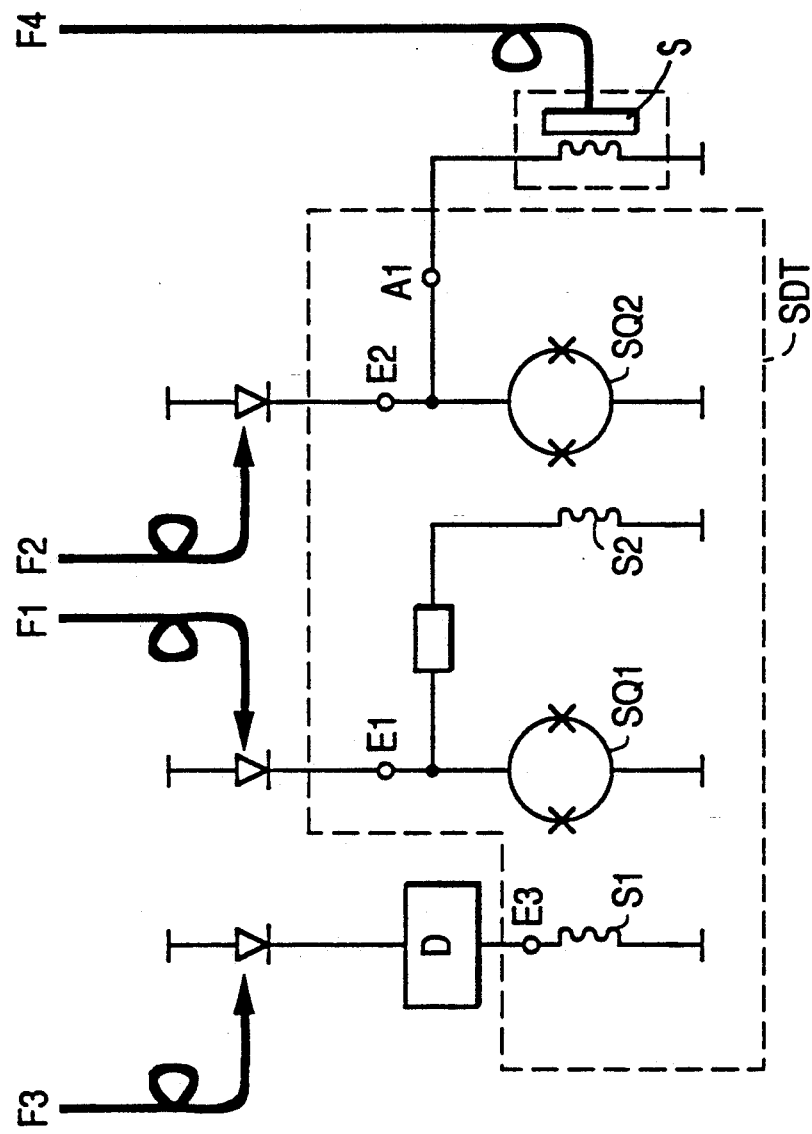
FIG. 1 is a schematic diagram of an A/D converter according to the invention.

FIG. 1 shows a schematic diagram of an A/D converter according to the invention which contains SQUIDs, SQ1, SQ2 and the coupling-in and coupling-out coils S1, S2. The arrangement inside the dashed box SDT corresponds to an A/D converter according to the prior art as described primarily in DE 36 16 865, having inputs and outputs as follows:

E1: Direct current for adjusting the working points
E2: Pulse for scanning the input signals of the SQUID comparators
E3: Feedback leads
A1: Pulse output for information on the switching state of the SQUID comparators.

The current magnitudes on E1, E2, and A1 are preferably in the range from 0 to 1 mA and the current magnitude at bipolar input E3 are in the range form $-1$ mA to $+1$ mA.

According to the invention, optical light guides (fibers $F_1$, $F_2$, $F_3$, and $F_4$) are connected to the respective inputs and outputs of the A/D converter. Inputs E1 and E2 are served directly by the opto-electronic conversion of a light pulse into a current pulse. This is accomplished by optoelectronics transducers, such as photodiodes, at the fiber ends of fibers F1 and F2, preferably made of gallium arsenide or silicon, such as for example diode-type BPX65.

Input E3 may not be directly converted here, for reasons of stability and because of the necessary bipolarity. Instead, a frequency-modulated optical signal is converted optoelectronically into a current signal. To obtain the useful signal from this modulated signal, it is demodulated in a demodulator D, for example a low-pass filter, before being fed to E3.

Output Aa supplies a current pulse in the mA range. A magneto-optical transducers, such as magneto-optical layer S, is provided to convert it into a light pulse for fiber F4. The current pulse generates a magnetic field through a suitable coil that changes the polarization angle upon reflection at a magneto-optical layer made of a mixture of EuS and $EuF_2$ (magneto-optical Faraday effect). As a result, the signal can be read with the aid of polarized light. In H. U. Habermeier et al., "The Quantitative Determination of Flux-Density Gradients in Type II Superconductors by Means of the magneto-Optical Faraday Effect" in *Phys. Stat. Sol* (a) 50, 187 (1987), there are descriptions of studies of superconducting materials using the magneto-optical Faraday effect on a $EuS/EuF_2$ layer.

Figure 2:
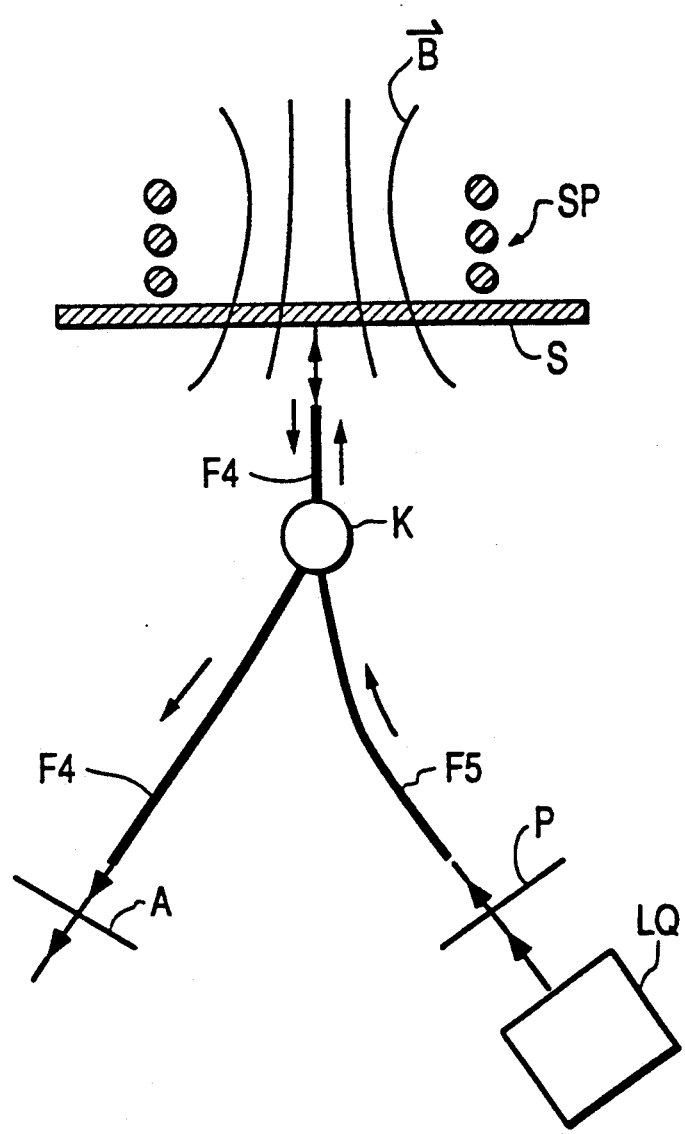
FIG. 2 is a device for electro-optical conversion of the output signal from an AD converter according to the invention.

FIG. 2 shows one possible arrangement for electro-optical conversion of the output signals in a schematic representation.

Light from a light source LQ passing through a polarizer P becomes polarized and is coupled into a fiber F5. At fiber coupler K it is branched into fiber F4 and directed towards magneto-optical layer S, where it is reflected and re-enters the fiber. The back-reflected light is guided through fiber F4 to an analyzer A which is transparent only to light in a certain polarization plane. The light is measured by a photodiode for example, behind analyzer A.

A current pulse at output A1 (see FIG. 1) of the A/D converter passes through coil SP and generates a magnetic field D that changes the polarization angle when the light is reflected at layer S.

For example, when the polarization planes at polarizer P and analyzer A are crossed at 90° and magnetio field B=0, no light will pass through analyzer A. Only a magnetic field B that is greater than 0 will produce a non-vanishing optical signal behind analyzer A whose magnitude depends upon magnetic field B and thus upon the output signal A1.

Advantageously, the coil diameter of coils Sp is made smaller than 10 μm. With a typical electrical output signal of about 1 mA at output A1, one therefore obtains a magnetic field B greater than 1 mT.

Commercial optical fibers such as multimode, monomode, or gradient fibers can be used according to the invention to supply all of the necessary outputs and inputs of the superconducting A/D converter.

Figure 3:
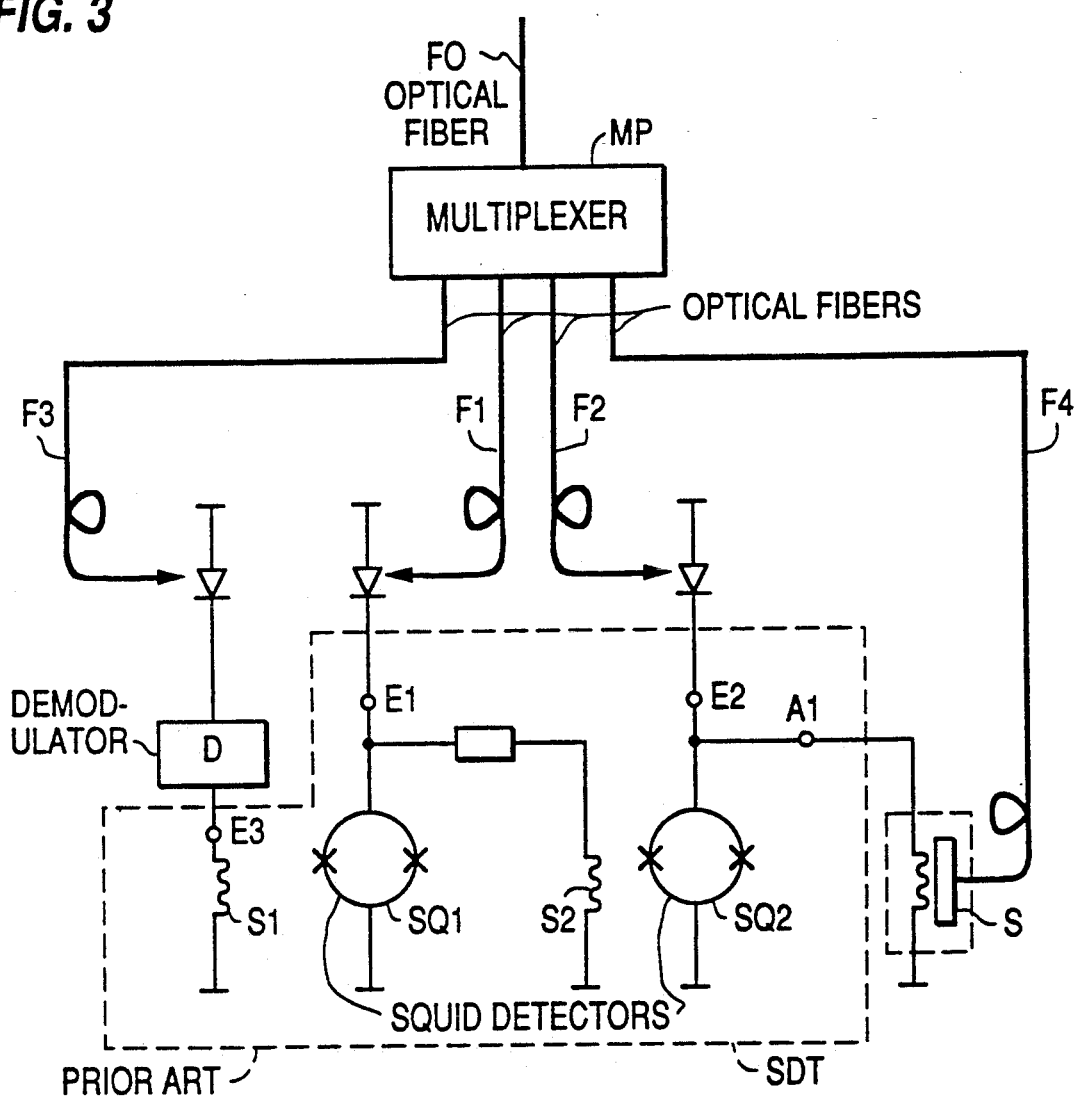
FIG. 3 shows an A/D converter according to the invention in which the input and output fibers are coupled to a single fiber by means of a multiplexer.

The invention also is applicable to superconducting A/D converters of other designs. Depending on the application and on the requirements, one or more of the inputs and outputs can be replaced by optical fibers. In addition, several inputs or outputs can be supplied by a single fiber using a frequency multiplexer as shown in FIG. 3. Optical frequency multiplexers are described in B. Anderer et al, "Development of a 10-Channel Wavelength Division Multiplexer/Demultiplexer Fabricated by an X-ray Micromachining Process" in Int. Congress on Optical Science and Engineering, Sept. 19-23, 1988, Hamburg, *Proc. SPIE*.

Superconducting A/D converters according to the invention are especially suitable in the field of medical technology for biomagnetic diagnosis of brain and heart diseases. Systems with particularly high numbers of channels (>100) are required in this field.

A/D converters of this kind are used for military applications as well, especially for locating submarines and mines. In the high-frequency engineering area they are known as readout circuits for spectrum analyzers and phase shifters.

Other applications can be found in the field of geoprospecting, gravitation measurement, and general measuring technology.

The devices according to the invention are used primarily for measuring magnetic field or currents. The values measured differ considerably, however:

Geological prospecting: Magnetic fields, magnetic field gradients

Gravitation measurements: Acceleration, acceleration gradients

Measurement technology: Magnetic fields, currents, voltages, etc.

Although the invention has been described and illustrated in detail, it is to be clearly understood that the same is by way of illustration and example, and is not to be taken by way of limitation. The spirit and scope of the present invention are to be limited only by the terms of the appended claims.

We claim:

1. Superconducting A/D converter apparatus comprising:
   a superconducting A/D converter of the type having at least one input adapted to receive an electrical input signal, and at least one output adapted to generate an electrical output signal;
   at least one input light guide for providing an input analog signal;
   at least one output light guide for providing an output digital signal that varies according to said input analog signal;
   at least one optoelectronic transducer having an input coupled to at least one input light guide of said superconducting A/D converter and an output coupled to said input of said superconducting A/D converter;
   at least one magneto-optical transducer coupled to an output of said superconducting A/D converter and an output coupled to said output light guide;
   whereby the input and output light guides are utilized to reduce thermal losses in the superconducting A/D converter apparatus.

2. A/D converter according to claim 1, wherein all inputs of said A/D converter are coupled to light guides by means of optoelectronic transducers.

3. A/D converter according to claim 1, wherein a multiplicity of input and output wave guides are supplied by a single fiber by means of an optical multiplexer.

4. Interface apparatus for use with a superconducting A/D converter having at least one input adapted to receive an electrical input signal and at least one output adapted to generate an electrical output signal, said interface apparatus comprising:
   at least one input light guide;
   at least one output light guide;
   at least one optoelectronic transducer having an input coupled to at least one input light guide of said A/D converter and an output coupled to said input of said superconducting A/D converter;
   at least on magneto-optical transducer having an input coupled to an output of said super conducting A/D converter and an output coupled to said output light guide; whereby the input and output light guides are utilized to reduce thermal losses in the superconducting A/D converter apparatus.

* * * * *